United States Patent
Jacobsen

(10) Patent No.: US 7,382,959 B1
(45) Date of Patent: Jun. 3, 2008

(54) OPTICALLY ORIENTED THREE-DIMENSIONAL POLYMER MICROSTRUCTURES

(75) Inventor: Alan J. Jacobsen, Los Angeles, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 11/580,335

(22) Filed: Oct. 13, 2006

(51) Int. Cl.
G02B 6/10 (2006.01)
G03C 5/00 (2006.01)
G03C 5/04 (2006.01)

(52) U.S. Cl. .................. 385/129; 385/131; 430/290; 430/396

(58) Field of Classification Search ......... 385/129–130
See application file for complete search history.

(56) References Cited

U.S. PATENT DOCUMENTS

| | | | |
|---|---|---|---|
| 4,575,330 A | 3/1986 | Hull | |
| 5,006,937 A | 4/1991 | Nonoshita et al. | |
| 5,402,514 A * | 3/1995 | Booth et al. | 385/130 |
| 6,274,288 B1 * | 8/2001 | Kewitsch et al. | 430/270.14 |
| 6,387,593 B1 * | 5/2002 | Kewitsch et al. | 430/290 |
| 6,631,231 B2 | 10/2003 | Mizuuchi et al. | |
| 6,650,817 B2 | 11/2003 | Murali | |
| 6,660,192 B1 | 12/2003 | Kim et al. | |
| 6,684,007 B2 | 1/2004 | Yoshimura et al. | |
| 6,823,116 B2 * | 11/2004 | Inui et al. | 385/39 |
| 6,862,393 B2 | 3/2005 | Nashimoto | |
| 6,879,757 B1 | 4/2005 | Zhou et al. | |
| 6,898,362 B2 | 5/2005 | Forbes et al. | |
| 6,925,233 B2 * | 8/2005 | Inui et al. | 385/39 |
| 6,932,880 B2 * | 8/2005 | Inui et al. | 156/272.2 |
| 6,952,504 B2 | 10/2005 | Bi et al. | |
| 6,993,235 B2 | 1/2006 | Takagi et al. | |
| 7,006,747 B2 | 2/2006 | Escuti et al. | |
| 7,020,374 B2 | 3/2006 | Talin et al. | |
| 7,024,093 B2 | 4/2006 | Shelnut et al. | |
| 2004/0021237 A1 | 2/2004 | Shimizu et al. | |
| 2004/0154252 A1 | 8/2004 | Sypeck et al. | |
| 2004/0264863 A1 | 12/2004 | Suzuki et al. | |
| 2005/0135745 A1 | 6/2005 | Greiner et al. | |
| 2005/0202206 A1 | 9/2005 | Wadley et al. | |
| 2005/0255289 A1 | 11/2005 | Wadley | |

(Continued)

OTHER PUBLICATIONS

Kewitsch et al., "Nonlinear Optical Properties of Photoresists for Projection Lithography", Applied Physics Letters, Jan. 22, 1996, 455-457, vol. 68 (No. 4), USA.

(Continued)

*Primary Examiner*—Hemang Sanghavi
*Assistant Examiner*—Kajli Prince
(74) *Attorney, Agent, or Firm*—Christie, Parker, & Hale

(57) ABSTRACT

A method and system of creating one or more waveguides and/or patterning these waveguides to form a 3D microstructure that uses mask and collimated light. In one embodiment, the system includes at least one collimated light source selected to produce a collimated light beam; a reservoir having a photo-monomer adapted to polymerize by the collimated light beam; and a mask having at least one aperture and positioned between the at least one collimated light source and the reservoir. Here, the at least one aperture is adapted to guide a portion of the collimated light beam into the photo-monomer to form the at least one polymer waveguide through a portion of a volume of the photo-monomer.

23 Claims, 9 Drawing Sheets

U.S. PATENT DOCUMENTS

2005/0287696 A1    12/2005    Dumais et al.
2006/0029348 A1     2/2006    Kempen et al.
2006/0080835 A1     4/2006    Kooistra et al.

OTHER PUBLICATIONS

Shoji et al., "Optically-Induced Growth of Fiber Patterns into a Photopolymerizable Resin", Applied Physics Letters, Aug. 2, 1999, 737-739, vol. 75 (No. 5), USA.

Kagami et al., "Light-Induced Self-Written Three-Dimensional Optical Waveguide", Applied Physics Letters, Aug. 20, 2001, 1079-1081, vol. 79 (No. 8), USA.

Bertsch et al., "Microstereolithography: A Review", Materials Research Symposium Proceedings, 2003, 1-13, vol. 758, USA.

Sun et al., "Two-Photon Photo Polymerization and 3D Lithographic Microfabrication", APS, 2004, 169-273, vol. 170, USA.

Chuang et al., "A New Method to Fabricate Polymer Waveguides", Progress in Electromagnetics Research Symposium, Aug. 22-26, 2005, 92-95, Hangzhou, China.

Jang et al., "3D Polymer Microframes That Exploit Length-Scale-Dependent Mechanical Behavior", Advanced Materials, 2006, 2123-2137, vol. 18.

\* cited by examiner

US 7,382,959 B1

OPTICALLY ORIENTED THREE-DIMENSIONAL POLYMER MICROSTRUCTURES

FIELD OF THE INVENTION

The present invention relates to patterning one or more polymer waveguides to form an ordered three-dimensional (3D) microstructure and/or a system and method to fabricate the one or more polymer waveguides.

BACKGROUND OF THE INVENTION

An ordered three-dimensional (3D) microstructure is an ordered 3D structure at the micrometer scale. Currently, polymer cellular materials that are mass produced are created through various foaming processes, which all yield random (not ordered) 3D microstructures. Techniques do exist to create polymer materials with ordered 3D microstructures, such as stereolithography techniques; however, these techniques rely on a bottom-up, layer-by-layer approach which prohibits scalability.

A stereolithography technique is a technique that builds a 3D structure in a layer-by-layer process. This process usually involves a platform (substrate) that is lowered into a photo-monomer (photopolymer) bath in discrete steps. At each step, a laser is scanned over the area of the photo-monomer that is to be cured (polymerized) for that particular layer. Once the layer is cured, the platform is lowered a specific amount (determined by the processing parameters and desired feature/surface resolution) and the process is repeated until the full 3D structure is created. One example of such a stereolithography technique is disclosed in Hull et al., "Apparatus For Production Of Three-Dimensional Objects By Stereolithography," U.S. Pat. No. 4,575,330, Mar. 11, 1986, which is incorporated by reference herein in its entirety.

Modifications to the above described stereolithography technique have been developed to improve the resolution with laser optics and special resin formulations, as well as modifications to decreasing the fabrication time of the 3D structure by using a dynamic pattern generator to cure an entire layer at once. One example of such a modification is disclosed in Bertsch et al., "Microstereolithography: A Review," Materials Research Society Symposium Proceedings, Vol. 758, 2003, which is incorporated by reference herein in its entirety. A fairly recent advancement to the standard stereolithography technique includes a two-photon polymerization process as disclosed in Sun et al., "Two-Photon Polymerization And 3D Lithographic Microfabrication," APS, Vol. 170, 2004, which is incorporated by reference herein in its entirety. However, this advance process still relies on a complicated and time consuming layer-by-layer approach.

3D ordered polymer cellular structures have also been created using optical interference pattern techniques, also called holographic lithography; however, structures made using these techniques have an ordered structure at the nanometer scale and the structures are limited to the possible interference patterns, as described in Campbell et al., "Fabrication Of Photonic Crystals For The Visible Spectrum By Holographic Lithography," NATURE, Vol. 404, Mar. 2, 2000, which is incorporated by reference herein in its entirety.

Previous work has also been done on creating polymer optical waveguides. A polymer optical waveguide can be formed in certain photopolymers that undergo a refractive index change during the polymerization process. If a monomer that is photo-sensitive is exposed to light (typically UV) under the right conditions, the initial area of polymerization, such as a small circular area, will "trap" the light and guide it to the tip of the polymerized region due to this index of refraction change, further advancing that polymerized region. This process will continue, leading to the formation of a waveguide structure with approximately the same cross-sectional dimensions along its entire length. The existing techniques to create polymer optical waveguides have only allowed one or a few waveguides to be formed and these techniques have not been used to created a self-supporting three-dimensional structure by patterning polymer optical waveguides.

As such, there continues to be a need to create polymer cellular materials with ordered microstructures on a large and useful scale using a simple technique.

SUMMARY OF THE INVENTION

An aspect of the present invention provides a method and system of fabricating polymer cellular (porous) materials with an ordered three-dimensional (3D) microstructure using a simple technique. These cellular materials are created from a pattern of self-propagating polymer waveguides, which are formed in an appropriate photopolymer. This method and system can create truly 3D microstructures without building the structures layer-by-layer as with stereolithography and other prototyping techniques.

Another aspect of the present invention creates polymer cellular materials with ordered microstructures on a large and useful scale.

In an embodiment of the present invention, a system for forming at least one polymer waveguide is provided. The system includes at least one light source selected to produce a light beam; a reservoir having a photo-monomer adapted to polymerize by the light beam; and a patterning apparatus adapted to guide a portion of the light beam into the photo-monomer to form the at least one polymer waveguide through a portion of a volume of the photo-monomer.

In one embodiment of the system, the at least one light source includes at least one collimated light source, the light beam is a collimated light beam, the patterning apparatus includes a mask having at least one aperture and positioned between the at least one collimated light source and the reservoir, and the at least one aperture is adapted to guide the portion of the collimated light beam into the photo-monomer to form the at least one polymer waveguide through the portion of the volume of the photo-monomer.

In one embodiment of the system, the at least one polymer waveguide includes a plurality of waveguides, and the at least one aperture is a single aperture adapted to form the plurality of waveguides.

In one embodiment of the system, the at least one collimated light source is a single collimated light source, the plurality of waveguides are formed from a plurality of exposures of the collimated light beam of the single collimated light source with the mask having the single aperture, and the single collimated light source is adapted to move with respect to the mask between each of the exposures.

In one embodiment of the system, the at least one collimated light source includes a plurality of collimated light sources adapted to produce and direct a plurality of collimated light beams at different angles with respect to a point of the mask, and the plurality of waveguides are formed from a single exposure of the plurality of collimated light beams of the plurality of collimated light sources with the mask having the single aperture.

In one embodiment of the system, the at least one polymer waveguide includes a plurality of waveguides, and the at least one aperture includes a plurality of apertures adapted to form the plurality of waveguides. Here, the plurality of polymer waveguides may be a three-dimensional (3D) ordered polymer microstructure. Also, a spacing between the plurality of waveguides in the 3D ordered polymer microstructure may correspond with a pattern of the plurality of apertures.

In one embodiment of the system, the mask is in contact with at least one surface of the monomer.

In one embodiment of the system, the system further includes a substrate substantially transparent to the collimated light beam interposed between the mask and the photo-monomer.

In another embodiment of the present invention, a method for forming at least one polymer waveguide is provided. The method includes: securing a volume of a photo-monomer; securing a mask having at least one aperture between at least one collimated light source and the volume of the photo-monomer; and directing a collimated light beam from the at least one collimated light source to the mask for a period of exposure time so that a portion of the collimated beam passes through the mask and is guided by the at least one aperture into the photo-monomer to form at least one waveguide through a portion of the volume of the photo-monomer.

In one embodiment of the method, the at least one waveguide has a cross sectional geometry substantially matching the designed aperture geometry on the mask.

In one embodiment of the method, the collimated light source has an incident power, and the period of exposure time is determined to base on the incident power and a desired length of the at least one waveguide.

In one embodiment of the method, the at least one polymer waveguide includes a plurality of waveguides, and the at least one aperture is a single aperture adapted to form the plurality of waveguides.

In one embodiment of the method, the at least one collimated light source is a single collimated light source, the plurality of waveguides are formed from a plurality of exposures of the collimated light beam of the single collimated light source with the mask having the single aperture, and the single collimated light source is adapted to move with respect to the mask between each of the exposures.

In one embodiment of the method, the at least one collimated light source includes a plurality of collimated light sources adapted to produce and direct a plurality of collimated light beams at different angles with respect to a point of the mask, and the plurality of waveguides are formed from a single exposure of the plurality of collimated light beams of a single collimated light source or of the plurality of collimated light sources with the mask having the single aperture.

In one embodiment of the method, the at least one polymer waveguide includes a plurality of waveguides, and the at least one aperture includes a plurality of apertures adapted to form the plurality of waveguides. Here, the method may further include removing any uncured photo-monomer to leave behind a three-dimensional (3D) ordered polymer microstructure. Here, the plurality of polymer waveguides may be a three-dimensional (3D) ordered polymer microstructure. Also, a spacing between the plurality of waveguides in the 3D ordered polymer microstructure may correspond with a pattern of the plurality of apertures.

In yet another embodiment of the present invention, a three-dimensional (3D) ordered polymer microstructure is provided. The 3D ordered polymer microstructure includes: a plurality of waveguides having a first waveguide extended along a first direction, a second waveguide extended along a second direction and patterned with the first waveguide, and a third waveguide extended along a third direction and patterned with the first waveguide and the second waveguide. Here, the plurality of waveguides are formed by polymers and patterned to form the 3D ordered microstructure.

In one embodiment of the 3D ordered polymer microstructure, the waveguides are patterned and formed by securing a volume of a photo-monomer, securing a mask having a plurality of apertures between at least one collimated light source and the volume of the photo-monomer, and directing a collimated light beam from the at least one collimated light source to the mask for a period of exposure time so that a portion of the collimated beam passes through the mask and is guided by the apertures into the photo-monomer to form the plurality of waveguides through a portion of the volume of the photo-monomer.

In yet a further embodiment of the present invention, a method for forming a plurality of patterned polymer waveguides is provided. The method includes: securing a volume of a photo-monomer; and patterning light from at least one light source for a period of exposure time in the photo-monomer to form the plurality of patterned polymer waveguides through a portion of the volume of the photo-monomer.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
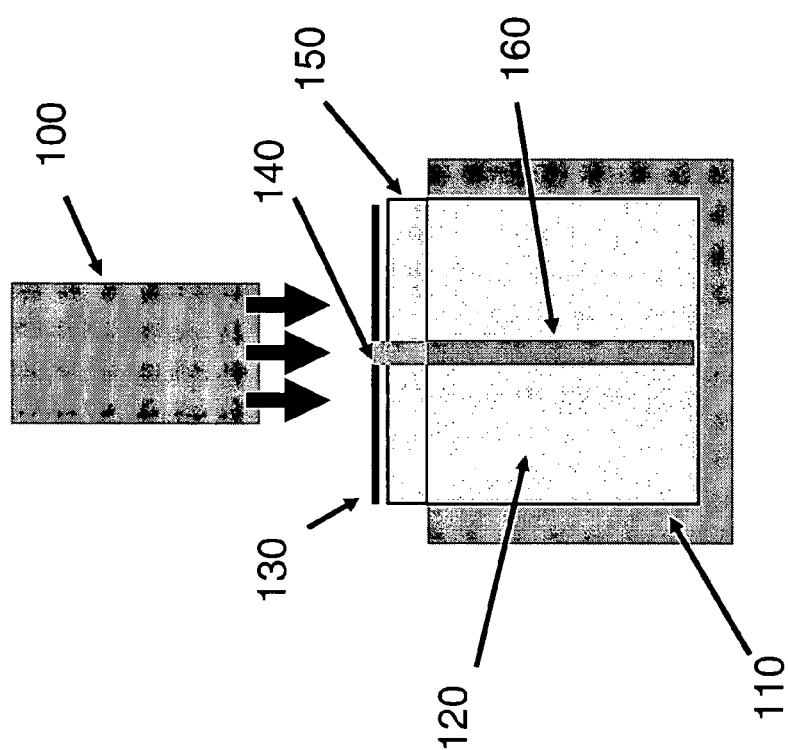
FIG. 1 is a schematic diagram of a system to form a single waveguide from a single collimated beam through a single aperture pursuant to aspects of the present invention.

In the following detailed description, only certain exemplary embodiments of the present invention are shown and described, by way of illustration. As those skilled in the art would recognize, the described exemplary embodiments may be modified in various ways, all without departing from the spirit or scope of the present invention. Accordingly, the drawings and description are to be regarded as illustrative in nature, and not restrictive.

According to one embodiment of the present invention, a fixed light input (collimated UV light) is used to cure (polymerize) polymer optical waveguides, which can self-propagate in a 3D pattern. The propagated polymer optical waveguides form an ordered 3D microstructure that can be polymerized without anything moving during the formation process to provide a path to large scale, inexpensive production.

The formed polymer cellular materials (3D microstructures) can be used as is, or as templates to form other materials with ordered 3D microstructures, such as metals or ceramics. Because of the simplicity in the processing, as well as the versatility in end material options, embodiments of the present invention have a wide range of applications, such as in lightweight structural materials; energy absorbing materials; heat transfer applications; deployable structures (space structures); conformable core structures; acoustic damping; hook and loop attachments; compliant structures; optics for sub-micron waveguide formation; single body casting/net shape manufacturing; alternate shapes for waveguide members (3D honeycomb); functionally graded structures; heat exchanger/insulator structures; 3D battery/fuel cell structures; thermal switch structures; catalyst support structures; filtration/separation structures; wicking materials/moisture control structures; directional optical coupler/flexible display structures; distributed lighting structures; electrical interconnects; sensor supports with high surface areas; biological growth templates; flexible body/reactive armors; stealth coatings; high friction/high wear surfaces; waveguides for other energy sources; flame retardant foams; etc.

As disclosed in Monro et al. "Topical Review Catching Light In Its Own Trap," Journal Of Modern Optics, 2001, Vol. 48, No. 2, 191-238, which is incorporated by reference herein in its entirety, some liquid polymers, referred to as photopolymers, undergo a refractive index change during the polymerization process. The refractive index change can lead to a formation of polymer optical waveguides. If a monomer that is photo-sensitive is exposed to light (typically UV) under the right conditions, the initial area of polymerization, such as a small circular area, will "trap" the light and guide it to the tip of the polymerized region, further advancing that polymerized region. This process will continue, leading to the formation of a waveguide structure with approximately the same cross-sectional dimensions along its entire length.

One embodiment of the present invention creates a polymer cellular material with an ordered 3D microstructure by creating a pattern of self-propagating optical waveguides in an appropriate photopolymer. A formation of a single polymer waveguide will be described in more detail below, followed by a more detailed description on how to pattern these polymer waveguides to form an ordered 3D microstructure.

Formation of Single Polymer Waveguide with Single Aperture

Figure 2:
FIG. 2 illustrates examples of different aperture shapes pursuant to aspects of the present invention.
Figure 2:
Figure 2:
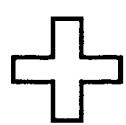
Figure 2:
Figure 2:
Figure 2:
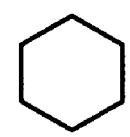
Figure 2:
Figure 2:
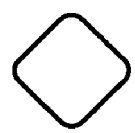
Figure 2:
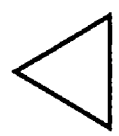
Figure 2:
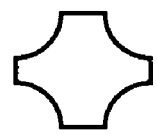
Figure 2:
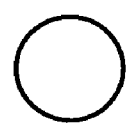
Figure 2:

Referring to FIG. 1, a system to form a single optical waveguide according to an embodiment of the present invention includes a collimated light source 100, a reservoir (mold) 110 having a volume of monomer 120 that will polymerize at a wavelength of a collimated light beam provided by the light source 100, and a patterning apparatus, such as a mask 130 with a single aperture (open area) 140 of a given shape and dimension. For example, as shown FIG. 2, the aperture 140 may be in a shape of a triangle, a pentagon, a hexagon, a polygon, an oval, a star, etc.

Referring back to FIG. 1, a single collimated beam is directed through the aperture 140 in the mask 130 to the monomer 120. Between the mask 130 and the monomer 120, there may be a substrate 150. The substrate can be composed of a material, such as glass, Mylar, and other suitable materials that will transmit the incident light beam to the monomer 120. That is, in one embodiment of the present invention, the substrate 150 is substantially transparent to the incident light beam. On the surface of the monomer 120, in the area exposed to a portion of the light beam, an optical waveguide 160 will begin to polymerize.

In one embodiment, the index of refraction change between the polymer and monomer will "trap" and "focus" the light in the polymer and guide the polymerization process. Due to this self-guiding/self-focusing effect, the polymerized waveguide 160 will form with an approximately constant cross-section and a length much greater than the cross-sectional dimensions. The direction in which this polymer waveguide 160 will grow is dependent on the direction of the incident beam. The cross-section of the polymer waveguide 160 is dependent on the shape and dimensions of the incident collimated beam, which in turn is dependent on the shape and dimensions of the aperture 140 in the mask 130. The length to which the polymer waveguide 160 can "grow" is dependent on a number of parameters including the size, intensity, and exposure time of the incident beam, as well as the light absorption/transmission properties of the photopolymer. The time in which it takes to form a polymer waveguide depends on the kinetics of the polymerization process.

To put it another way, in one embodiment, when the portion of the collimated light beam passes through the mask 130 and first hits the liquid photo-monomer 120, a polymer "tip" is formed. There is a large enough difference between the refractive index of the monomer and the polymer to cause internal reflection of the light in the polymer—this is the same principle as when light travels through fiber optics. Because of this internal reflection effect, the light is essentially focused to the tip of the polymer, causing the monomer at the tip to cure (i.e. polymerize). This will also propagate the tip of the polymer through the liquid monomer 120, forming the self-propagating polymer optical waveguide 160. In addition, because of this internal reflection affect, the waveguide 160 can be "very" long with respect to the cross-sectional dimensions, all while maintaining a constant cross-section through its length. Eventually the formation of the polymer waveguide 160 will stop at the end of the monomer reservoir 110, or it will stop prior to that if there is not enough energy to polymerize the monomer 120. This happens because the polymer itself will absorb some of the portion of the collimated light beam passing through the mask 130.

Formation of Multiple Polymer Waveguides with Single Aperture

As mentioned above, the direction in which the polymer waveguide will form is dependent on the angle of the incident collimated beam. If the collimated beam is perpendicular to a flat monomer surface (as shown in FIG. 1), the polymer waveguide will propagate, or grow perpendicular to the monomer surface. By contrast, referring to FIG. 3, if the incident collimated beam is directed at an angle, the polymer waveguide will grow at an angle relative to the monomer surface. Note this angle will be affected by the change in refractive index between the air and/or substrate and the monomer due to refraction.

Figure 3:
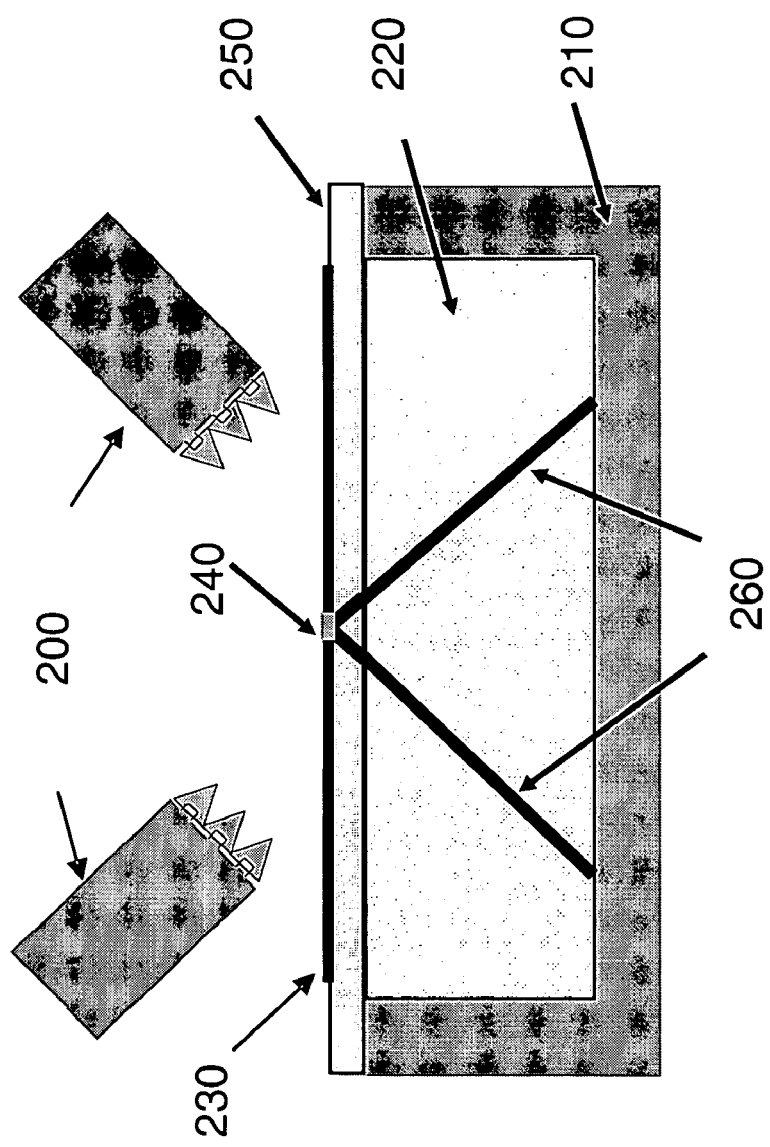
FIG. 3 is a schematic diagram of a system to form multiple waveguides from a single collimated beam or multiple collimated beams through a single aperture pursuant to aspects of the present invention.

That is, as shown in FIG. 3, a system to form multiple optical waveguides 260 according to an embodiment of the present invention includes one or more collimated light sources 200, a reservoir (mold) 210 having a volume of monomer 220 that will polymerize at a wavelength of collimated light beams provided by the light sources 200, and a patterning apparatus, such as a mask 230 with a single aperture (open area) 240 of a given shape and dimension. Between the mask 230 and the monomer 220, there may be a substrate 250.

Through the single aperture 240 as described above, the multiple waveguides 260 can be formed by directing multiple collimated beams at different angles through the aperture 240. That is, in one embodiment of the invention, a single collimated light source is used. Multiple waveguides are formed from a plurality of exposures of the collimated light beam of the single collimated light source with a mask having a single aperture, and the single collimated light source is adapted to move with respect to the mask between each of the exposures.

Alternatively, the multiple waveguides 240 can be formed one at a time through the single aperture 240 by simply changing the incident angle of a single collimated beam after the formation of each of the waveguides 240. That is, in another embodiment of the present invention, multiple collimated light sources are adapted to produce and direct multiple collimated light beams at different angles with respect to a point of a mask having a single aperture. Multiple waveguides are formed from a single exposure of the multiple light beams of the multiple collimated light sources with the mask having the single aperture.

Formation of 3D Microstructure Using Patterned Optical Waveguides

The technique to create a 3D polymer microstructure is based on the above described approach for forming multiple optical waveguides with a single aperture. However, instead of using a mask with a single aperture, a mask with a two-dimensional pattern of apertures is used to create a three-dimensional polymer microstructure as is shown in FIG. 4.

Figure 4:
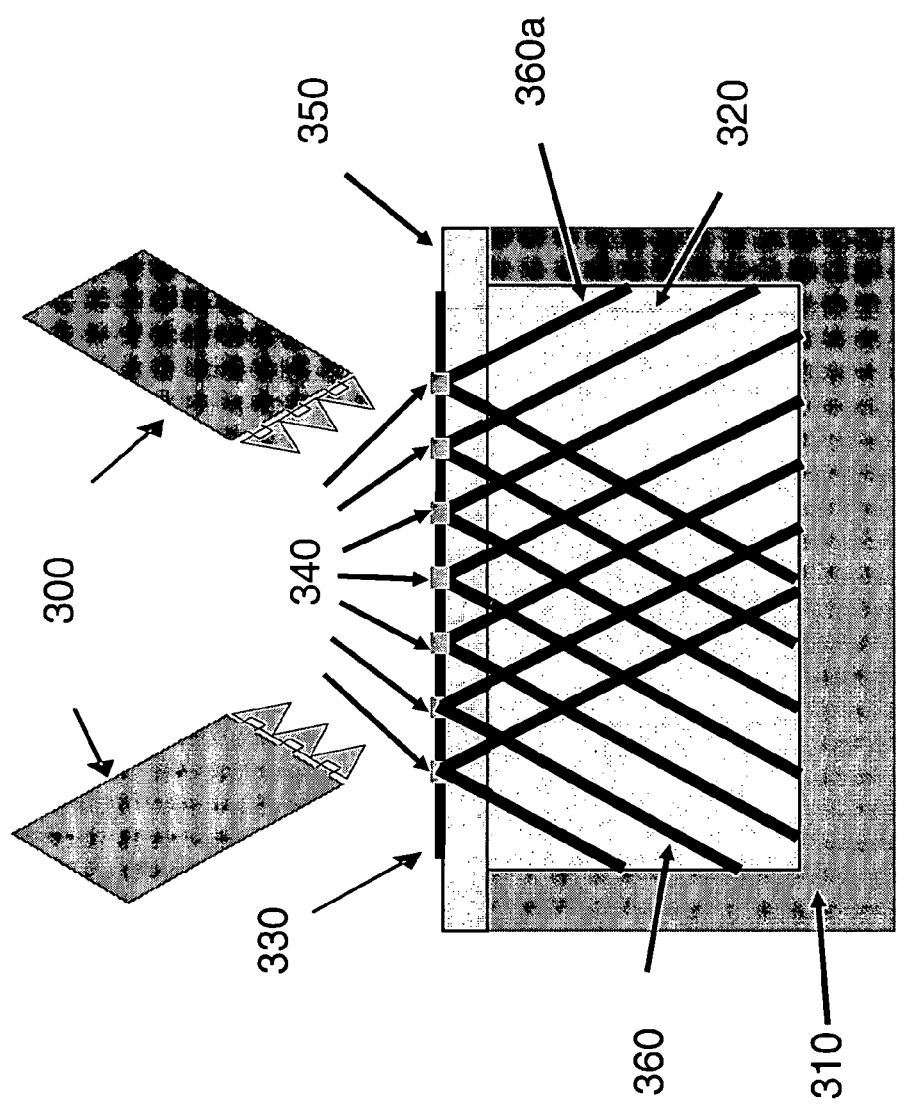
FIG. 4 is a schematic diagram of a system to form a 3D structure (e.g., a 3D ordered polymer microstructure) formed from multiple waveguides created using a single collimated beam or multiple collimated beams through multiple apertures pursuant to aspects of the present invention.
Figure 5B:
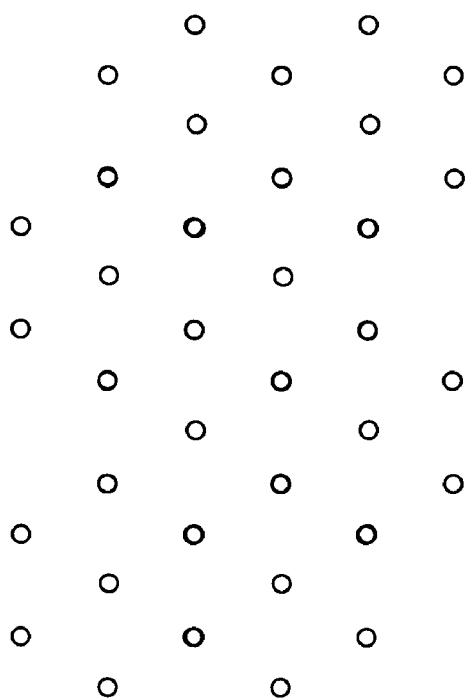
FIG. 5b illustrates an example of a hexagonal mask pattern (or a hexagonal mask aperture pattern) pursuant to aspects of the present invention.
Figure 5A:
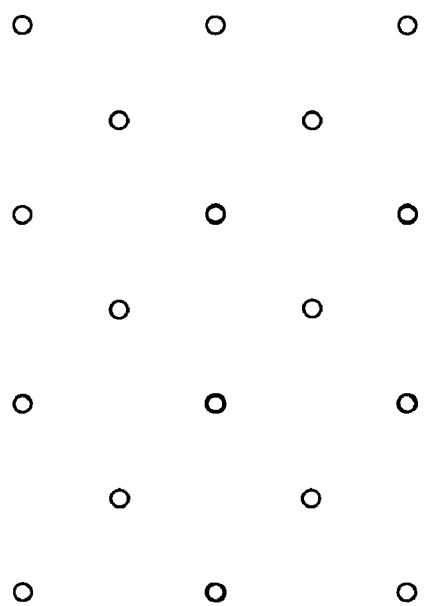
FIG. 5a illustrates an example of a square mask pattern (or a square mask aperture pattern) pursuant to aspects of the present invention.

Referring to FIG. 4, a system to form a 3D polymer microstructure according to an embodiment of the present invention includes one or more collimated light sources 300, a reservoir (mold) 310 having a volume of monomer 320 that will polymerize at a wavelength of collimated light beams provided by the light sources 300, and a patterning apparatus, such as a mask 330 with multiple apertures (open areas) 340. Each of the apertures 340 has a given shape and dimension substantially matching a cross section geometry of a waveguide (e.g., waveguide 360*a*). Between the mask 330 and the monomer 320, there may be a substrate 350. Here, in FIG. 4, a truly 3D network can be formed because the intersecting polymer waveguides 360 will simply polymerize together, but will not interfere with waveguide propagation. Also, the spacing between the plurality of waveguides 360 corresponds with the pattern of the plurality of apertures 340. The pattern of the apertures 340 may, for example, be in a square pattern as shown in FIG. 5*a* and/or in a hexagonal pattern as shown in FIG. 5*b*. The hole (aperture) spacing, i.e., distance between apertures 340 in the mask 330, and the number of waveguides 360 formed from each of the apertures 340 will determine the open volume fraction (i.e. open space) of the formed 3D microstructure.

As such, through the embodiment of FIG. 4, a 3D microstructure (or a 3D ordered polymer microstructure) can be designed for a given application. The design parameters include:

1) the angle and pattern of the polymer waveguides with respect to one another, 2) the packing, or relative density of the resulting cellular structure (or the open volume fraction), and 3) the cross-sectional shape and dimensions of the polymer waveguides.

Figure 8:
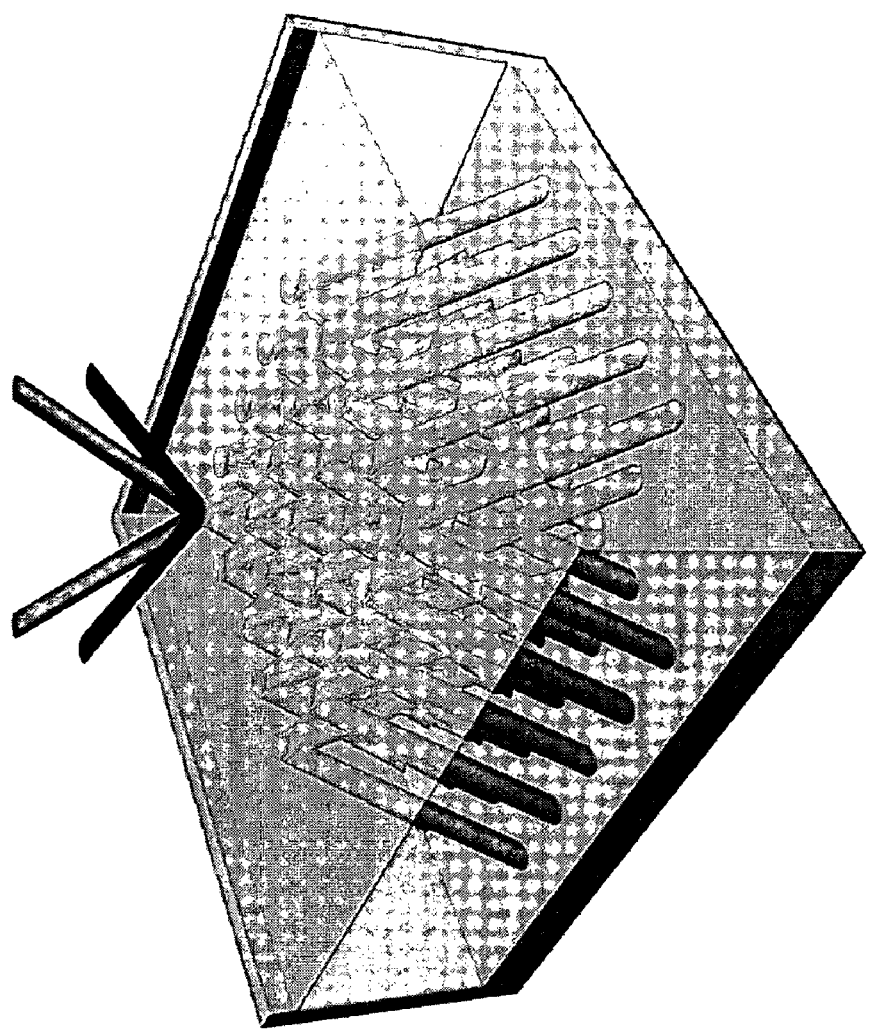
FIG. 8 is a 3D diagram for illustrating a formation of a 3D ordered polymer microstructure pursuant to aspects of the present invention.
Figure 9:
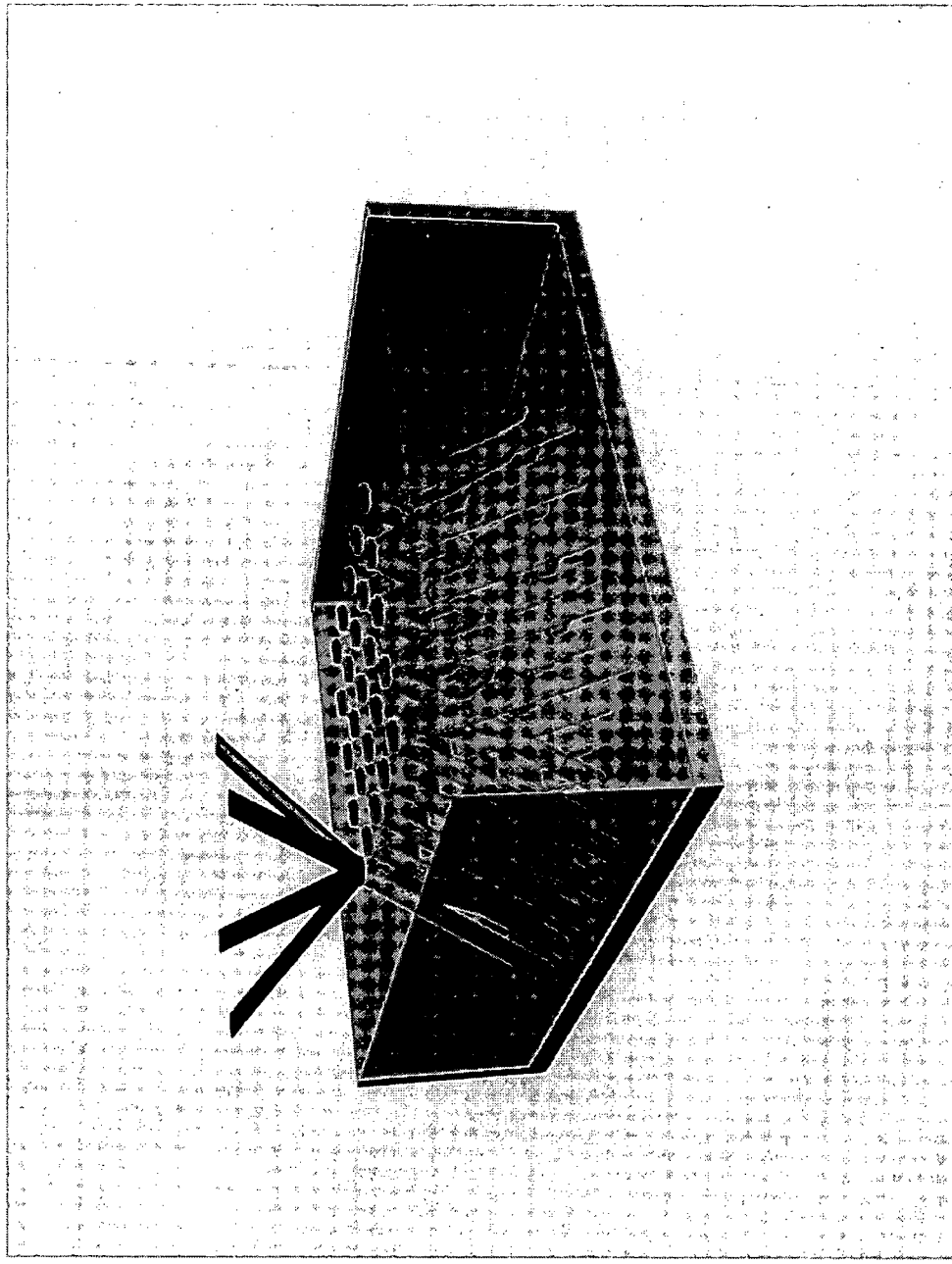
FIG. 9 is another 3D diagram for illustrating a formation of a 3D ordered polymer microstructure pursuant to aspects of the present invention.

FIG. 8 is a 3D diagram for illustrating a formation of a 3D ordered polymer microstructure pursuant to aspects of the present invention, and FIG. 9 is another 3D diagram for illustrating a formation of a 3D ordered polymer microstructure pursuant to aspects of the present invention.

Figure 6:
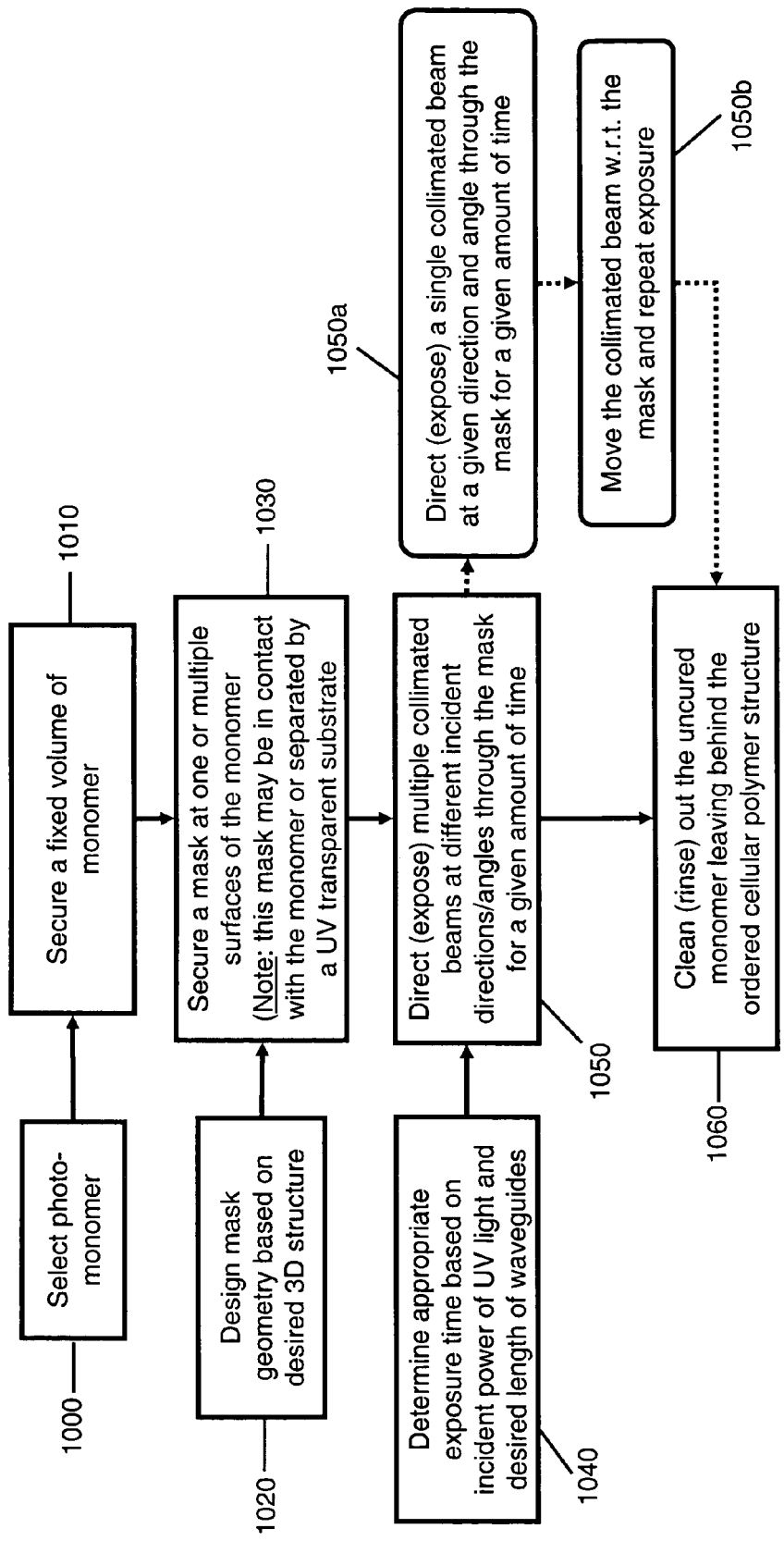
FIG. 6 is a process flow diagram for forming one or more polymer waveguides pursuant to aspects of the present invention.
Figure 7B:
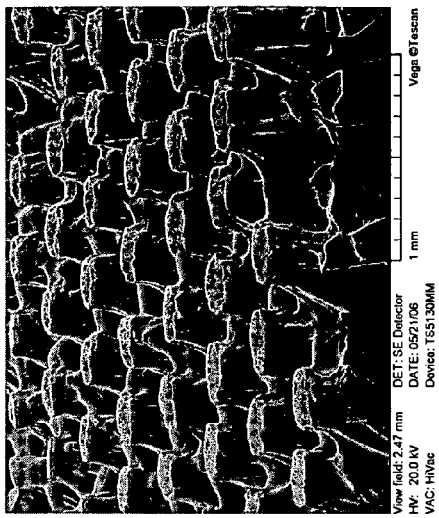
FIGS. 7a, 7b, 7c, and 7d are SEM micrographs of a sample 3D polymer microstructure pursuant to aspects of the present invention.
Figure 7D:
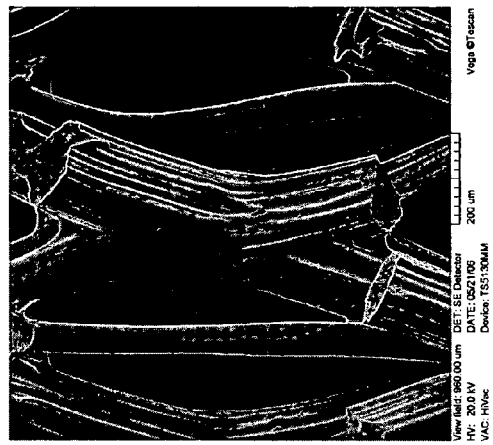
Figure 7A:
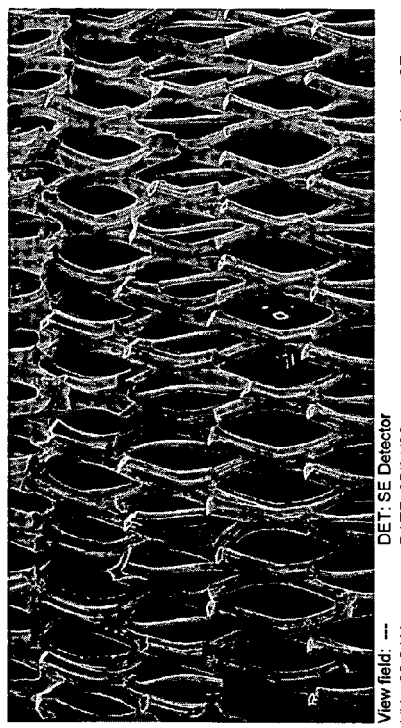
Figure 7C:
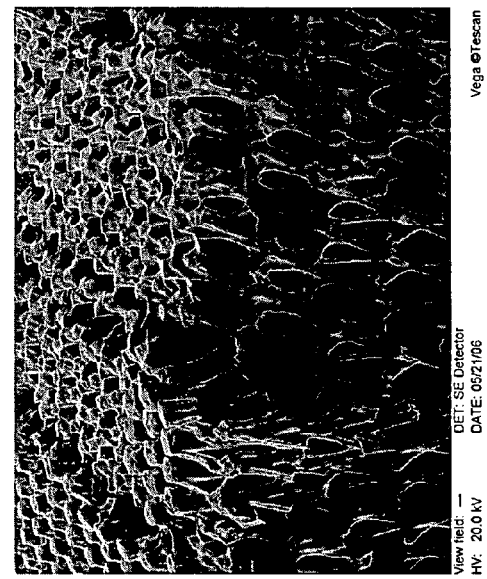

In more detail, FIG. 6 shows a method of forming a 3D ordered microstructure according to an embodiment of the present invention. As illustrated in FIG. 6, a photo-monomer is selected in block 1000. In block 1010, a volume of the selected photo-monomer is secured (e.g., in a reservoir). A mask geometry is designed based on a desired 3D structure in block 1020. A patterning apparatus, such as a mask having the designed geometry, is secured in block 1030. Here, the secured mask has at least one aperture between at least one collimated light source and the volume of the selected photo-monomer. In addition, the mask may be in contact with the monomer or separated by a substrate (e.g., by a UV transparent substrate).

In block 1040, an appropriate exposure time is determined based on incident power of a collimated light beam from the at least one collimated light source (e.g., an incident power of an UV light) and a desired length of one or more waveguides. The collimated light beam from the at least one collimated light source is directed to the mask for a period of exposure time so that a portion of the collimated beam passes through the mask and is guided by the at least one aperture into the photo-monomer to form at least one waveguide through a portion of the volume of the photo-monomer. Here, the at least one waveguide has a cross sectional geometry substantially matching the designed aperture geometry on the mask.

In one embodiment as shown in block 1050, multiple collimated beams at different incident directions and/or angles are directed through the mask for a given amount of time.

Alternatively, as shown in blocks 1050*a*, a single collimated beam at a given direction and angle is directed through the mask for a given amount of time. Then, at block 1050*b*, the collimated light beam is moved with respect to the mask and the exposure is repeated.

Then, at block 1060, any uncured photo-monomer is removed to leave behind a 3D ordered polymer microstructure. Here, in one embodiment, the plurality of polymer waveguides are used to form the 3D ordered polymer microstructure, and the 3D ordered polymer microstructure corresponds with the pattern of the plurality of apertures.

Patterning Large Area Microstructures

The resulting 3D polymer microstructure can be formed in seconds in the area where exposed to the incident collimated beam. Since the incident light and the monomer remain fixed with respect to one another during the formation of a polymer waveguide, the exposure area of the collimated beam(s) can be scanned over a larger surface area of monomer, leading to the formation of large-area structures. Alternatively, in one embodiment, a volume of monomer can continuously be fed under a fixed incident light pattern (created from a mask and collimated light) leading to a path for mass production.

Removing Monomer

As described, once the polymer cellular structure is formed in the volume of monomer, the remaining unpolymerized material (monomer) is removed leaving an open cellular polymer material that is the ordered 3D microstructure. Hereafter, an embodiment of the present invention will be described with reference to the following example. In the following example, a solvent that will dissolve the monomer (but not the polymer) is used to aid in the monomer removal.

EXAMPLE

In forming a 3D polymer structure, a mold with an open top is filled with a monomer that will polymerize in the UV regime. The depth of this mold cavity is approximately 6 mm and was filled with a commercial photo-monomer. This commercial photo-monomer polymerizes via free-radical polymerization when exposed to UV light (wavelength between 250-400 nm), and is highly transmissive to light in this wavelength range—a property required for the formation of polymer waveguides. Non-limiting examples of the photo-monomer include any suitable free-radical photopolymer materials, such as urethanes (polyurethanes), acrylates, methacrylates, cationic polymers, such photo-cured epoxies, etc.

A glass substrate that is substantially transparent to UV light is placed on the top surface of the monomer and a Mylar mask is placed on top of the substrate (e.g., see FIG. 4). For this embodiment, the substrate is used to provide space between the mask and the monomer so the polymerized cellular structure does not attach to the mask. In addition to acting as a spacer, the glass substrate helps to hold existing waveguides in place during subsequent waveguide formation.

The Mylar mask used in this embodiment has an array of 150 µm diameter holes arranged in a square pattern (e.g., see FIG. 5a). A single collimated UV beam from a Mercury arc lamp was directed through the mask at an angle approximately 45° with respect to the substrate. The power of the incident beam was approximately 3 mW/cm2 and the exposure time was 100s. Holding the incident angle with respect to the substrate fixed, the collimated beam was rotated 90° around the substrate normal and exposed for another 100s. This rotate and exposure step was repeated two more times, giving four total exposures. The 2D schematic of the resulting 3D microstructure from this particular embodiment is substantially the same as the embodiment of FIG. 4, and the 3D schematics of the resulting 3D microstructures from this particular embodiment are substantially the same as the embodiments of FIGS. 8 and 9.

SEM micrographs of a sample 3D polymer microstructure that can be formed by the above described exemplary technique are shown in FIGS. 7a, 7b, 7c, and 7d.

Recap of Certain Embodiments of the Present Invention

A single polymer waveguide can be created from a single collimated beam and a mask with a single aperture.

Multiple polymer waveguides can be created from multiple exposure time using a single collimated beam and a mask with a single aperture and moving the collimated beam with respect to the mask between each exposure.

Multiple polymer waveguides can be created from a single exposure time using multiple collimated beams at different incident angles and a mask with a single aperture.

A three-dimensional ordered polymer microstructure can be made from multiple polymer waveguides that are created from a mask with multiple apertures.

The shape and dimensions of the polymer waveguides is dependent on the shape and dimensions of the aperture(s) in the mask.

The relative angle(s) of the wave guides in the 3D structure is dependent on the incident angle of the collimated beam.

The length of the individual polymer waveguides that include the 3D structure is dependent on the photopolymer and the light source.

Any photopolymer that can be used to create optical waveguides can be used to create a 3D ordered polymer microstructure.

The area of exposure of the collimated beam(s) and the monomer can be moved with respect to each other to create a structure that is larger than the available exposure area. (This leads to mass/continuous production.)

In view of the foregoing, certain embodiments of the present invention provide methods and systems of creating one or more waveguides and/or patterning these waveguides to form a 3D microstructure. The systems and methods include the use of mask and collimated light.

While the invention has been described in connection with certain exemplary embodiments, it is to be understood by those skilled in the art that the invention is not limited to the disclosed embodiments, but, on the contrary, is intended to cover various modifications included within the spirit and scope of the appended claims and equivalents thereof.

What is claimed is:

1. A system for forming a plurality of polymer waveguides, the system comprising:
    at least one collimated light source adapted to produce a plurality of collimated light beams;
    a reservoir having a volume of photo-monomer adapted to polymerize by the collimated light beams; and
    a mask disposed between the at least one collimated light source and the reservoir, the mask extending along a single plane and having at least one aperture adapted to guide a first beam, a second beam and a third beam of the collimated light beams into the photo-monomer to respectively form a first waveguide, a second waveguide and a third waveguide of the polymer waveguides in a portion of the volume of the photo-monomer,
    wherein the first beam is directed at a first angle with respect to the single plane,
    wherein the second beam is directed at a second angle with respect to the single plane, the second angle being different from the first angle, wherein the third beam is directed at a third angle with respect to the single plane, the third angle being different from the first angle and the second angle, wherein the first waveguide forms a fourth angle with respect to the single plane, the fourth angle corresponding to the first angle, wherein the second waveguide forms a fifth angle with respect to the single plane, the fifth angle corresponding to the second angle, wherein the third waveguide forms a sixth angle with respect to the single plane, the sixth angle corresponding to the third angle, and wherein the first waveguide, the second waveguide and the third waveguide intersect each other at the at least one aperture.

2. The system of claim 1, wherein at least one of the first angle, the second angle or the third angle is an acute angle.

3. The system of claim 1, wherein at least one of the first beam, the second beam or the third beam is unfocused at the at least one aperture.

4. The system of claim 1, wherein the at least one collimated light source comprises first, second and third light sources adapted to respectively produce the first, second and third beams, and wherein the first beam, the second beam and the third beam are directed at the first angle, the second angle and the third angle, respectively, at the at least one collimated light source.

5. The system of claim 1, wherein the at least one collimated light source comprises first, second and third light sources adapted to respectively produce the first, second and third beams, and wherein the first, second and third waveguides are formed from a concurrent exposure of the first, second and third beams through the at least one aperture of the mask.

6. The system of claim 1, wherein the at least one aperture comprises a plurality of apertures adapted to guide the collimated light beams to form the plurality of polymer waveguides.

7. The system of claim 1, wherein the at least one collimated light source comprises a plurality of collimated light sources, wherein the at least one aperture comprises a plurality of apertures extending along the single plane and adapted to guide the collimated light beams to form the polymer waveguides from a concurrent exposure of the collimated light beams through the apertures, and wherein the plurality of polymer waveguides forms an interconnected three-dimensional (3D) ordered polymer microstructure.

8. The system of claim 7, wherein a spacing between the plurality of waveguides in the 3D ordered polymer microstructure corresponds with a pattern of the plurality of apertures.

9. The system of claim 1, wherein the mask is in contact with at least one surface of the volume of the photo-monomer.

10. The system of claim 1, further comprising a substrate substantially transparent to the collimated light beams, wherein the substrate is interposed between the mask and the volume of the photo-monomer.

11. A method for forming a plurality of polymer waveguides, the method comprising:

securing a volume of a photo-monomer;

placing a mask between at least one collimated light source and the volume of the photo-monomer, the mask extending along a single plane and having at least one aperture; and directing a plurality of collimated light beams, the collimated light beams including first, second and third collimated light beams, from the at least one collimated light source toward the at least one aperture to respectively form first, second and third waveguides of the polymer waveguides in a portion of the volume of the photo-monomer, wherein the first collimated light beam is directed at a first angle with respect to the single plane, wherein the second collimated light beam is directed at a second angle with respect to the single plane, the second angle being different from the first angle, wherein the third collimated light beam is directed at a third angle with respect to the single plane, the third angle being different from the first angle and the second angle, wherein the first waveguide forms a fourth angle with respect to the single plane, the fourth angle corresponding to the first angle, wherein the second waveguide forms a fifth angle with respect to the single plane, the fifth angle corresponding to the second angle, wherein the third waveguide forms a sixth angle with respect to the single plane, the sixth angle corresponding to the third angle, and wherein the first, second and third waveguides intersect each other at the at least one aperture.

12. The method of claim 11, wherein each of the first, second and third waveguides has a cross sectional geometry substantially matching a shape of the at least one aperture.

13. The method of claim 11, wherein the first collimated light beam has an incident power, wherein the first waveguide is formed by an exposure of the first collimated light beam through the at least one aperture, and wherein a time duration of the exposure is based on the incident power and a desired length of the first waveguide.

14. The method of claim 11, wherein at least one of the first collimated light beam, the second collimated light beam or the third collimated light beam is unfocused at the at least one aperture.

15. The method of claim 14, wherein the at least one collimated light source comprises first, second and third light sources adapted to respectively produce the first, second and third collimated light beams, and wherein the first collimated light beam, the second collimated light beam and the third collimated light beam are directed at the first angle, the second angle and the third angle, respectively, at the at least one collimated light source.

16. The method of claim 11, wherein the at least one collimated light source comprises first, second and third light sources adapted to respectively produce the first, second and third collimated light beams, and wherein the first, second and third waveguides are formed from a concurrent exposure of the first, second and third collimated light beams through the at least one aperture of the mask.

17. The method of claim 11, wherein the at least one collimated light source comprises a plurality of collimated light sources, and
   wherein the at least one aperture comprises a plurality of apertures extending along the single plane and adapted to guide the collimated light beams to form the plurality of polymer waveguides from a concurrent exposure of the collimated light beams through the apertures.

18. The method of claim 17, further comprising:
   removing any uncured photo-monomer to leave behind a three-dimensional (3D) ordered polymer microstructure.

19. The method of claim 17, wherein the plurality of polymer waveguides forms an interconnected three-dimensional (3D) ordered polymer microstructure.

20. The method of claim 19, wherein a spacing between the plurality of waveguides in the 3D ordered polymer microstructure corresponds with a pattern of the plurality of apertures.

21. A method for forming a plurality of patterned polymer waveguides, the method comprising:

securing a volume of a photo-monomer; and directing a plurality of light beams from at least one light source through a plurality of apertures of a mask disposed above the volume of the photo-monomer, the mask extending along a single plane, and to the photo-monomer to concurrently form the plurality of patterned polymer waveguides in a portion of the volume of the photo-monomer, wherein the patterned polymer waveguides intersect each other at a plurality of concurrently formed intersection regions located within the volume of the photo-monomer.

22. The system of claim 1, wherein the polymer waveguides form a self-supporting structure.

23. The method of claim 11, wherein the polymer waveguides form a self-supporting structure.

* * * * *